United States Patent [19]

Matsuoka et al.

[11] Patent Number: 5,059,135

[45] Date of Patent: Oct. 22, 1991

[54] CONTACT IN A SOCKET FOR AN ELECTRIC PART

[75] Inventors: Noriyuki Matsuoka; Kazumi Uratsuji, both of Tokyo, Japan

[73] Assignee: Yamaichi Electric Mfg. Co., Ltd., Tokyo, Japan

[21] Appl. No.: 533,791

[22] Filed: Jun. 6, 1990

[51] Int. Cl.$^5$ .................. H01R 13/15; H01R 11/22
[52] U.S. Cl. .................. 439/268; 439/264; 439/265
[58] Field of Search ............... 439/259, 262, 264–266, 439/268–269, 857, 856, 828, 829

[56] References Cited

U.S. PATENT DOCUMENTS

| | | | |
|---|---|---|---|
| 1,163,372 | 12/1915 | Schade, Jr. | 439/828 |
| 1,976,312 | 10/1934 | Wachsman | 439/828 |
| 4,140,361 | 2/1979 | Sochor | 439/856 X |
| 4,607,907 | 8/1986 | Bogursky | 439/856 X |
| 4,702,545 | 10/1987 | Moyaert | 439/856 |
| 4,750,891 | 6/1988 | Egawa | 439/259 |
| 4,773,873 | 9/1988 | Hillis | 439/259 X |
| 4,892,492 | 1/1990 | Mueller | 439/828 |

*Primary Examiner*—Larry I. Schwartz
*Assistant Examiner*—Julie R. Daulton
*Attorney, Agent, or Firm*—Wenderoth, Lind & Ponack

[57] ABSTRACT

A contact for insertion into a socket of an electric part and for receiving a terminal. The contact has a first elongated contact element and a second elongated contact element made of a resilient conductive material and disposed in spaced parallel relation, the elongated contact elements being interconnected at respective one ends thereof to form a contact terminal for insertion into a socket, and having at the other ends thereof respective first and second contact portions which are elongated transversely of the elongated contact elements and each extending toward the other elongated contact element, the first contact portion being further from the one ends in the direction of elongation of the elongated contact elements than the second contact portion and being in spaced opposed relation thereto and extending past the second contact portion in the direction of elongation of the first contact portion to form a pressure receiving part, the contact portions being positioned for being elastically displacable in a direction laterally of both the direction of elongation of elongated contact elements and the elongated contact portions without interfering with each other, whereby when a force is applied to the pressure receiving part in the lateral direction, the contact portions are separated in the lateral direction to form a terminal receiving opening therebetween into which a terminal can be inserted under no load, and upon release of the force, the contact portions move together to grip the terminal therebetween.

2 Claims, 8 Drawing Sheets

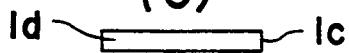
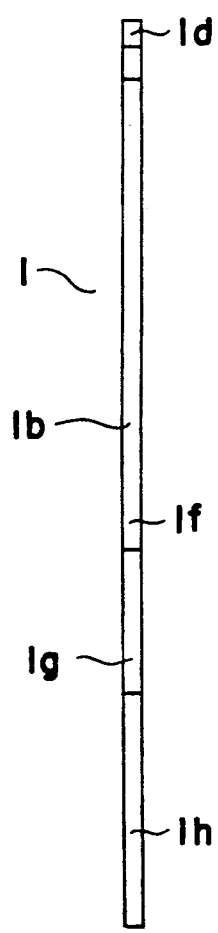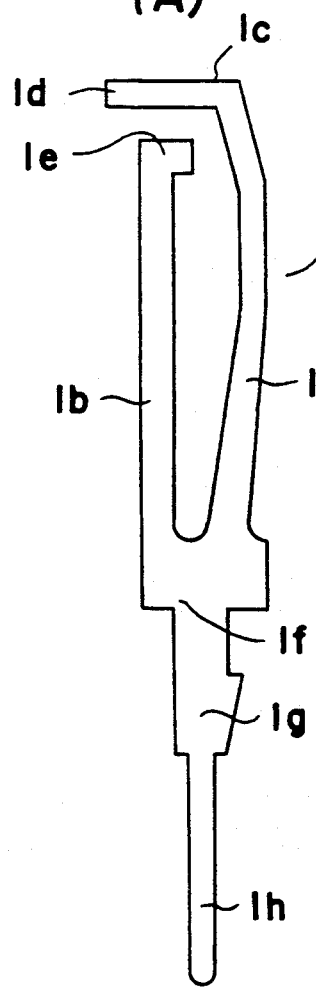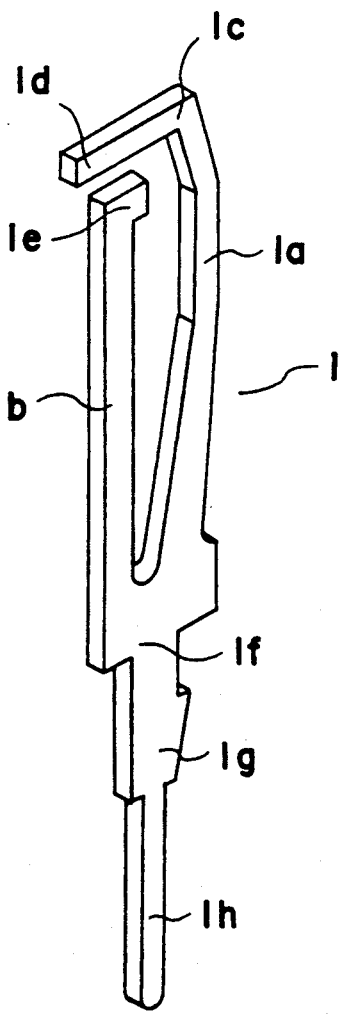

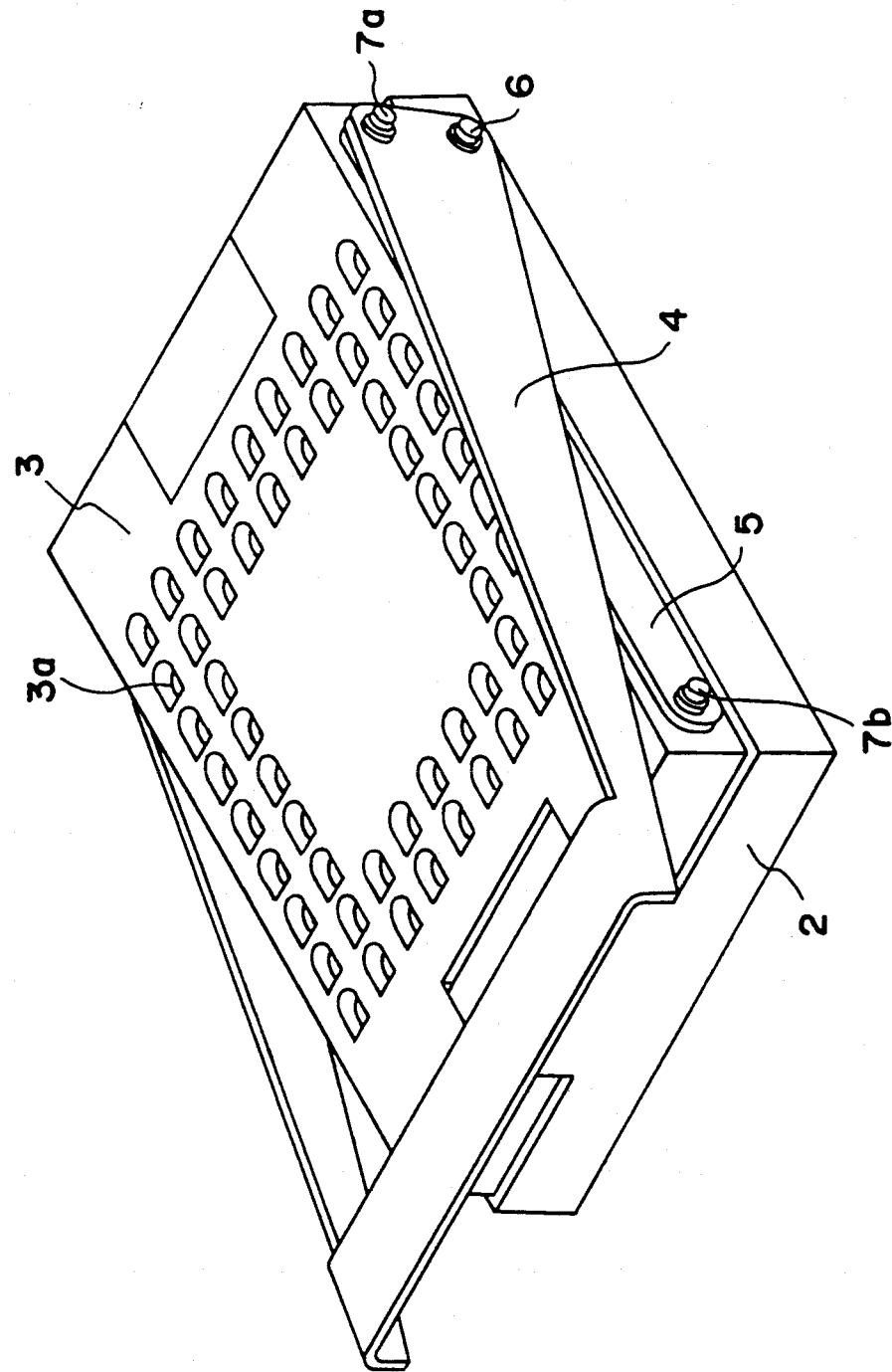

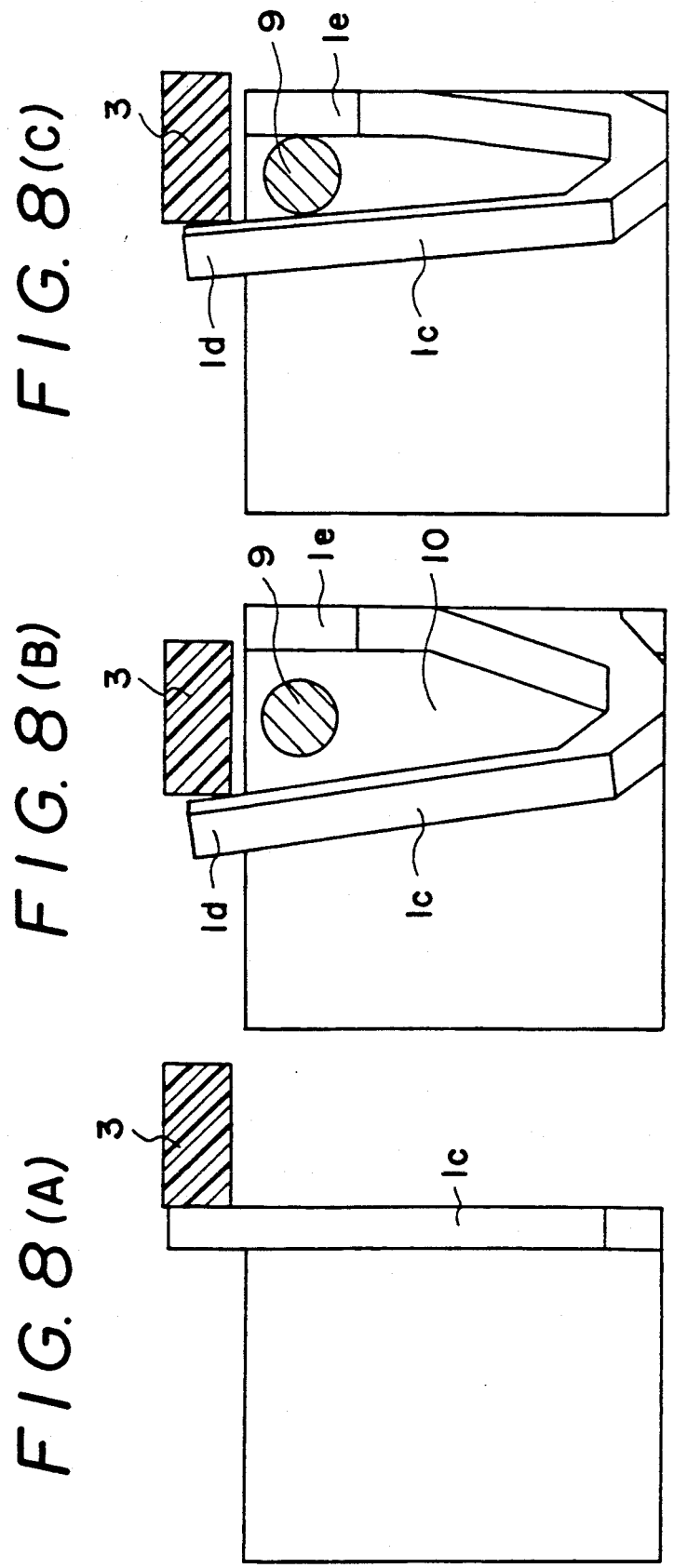

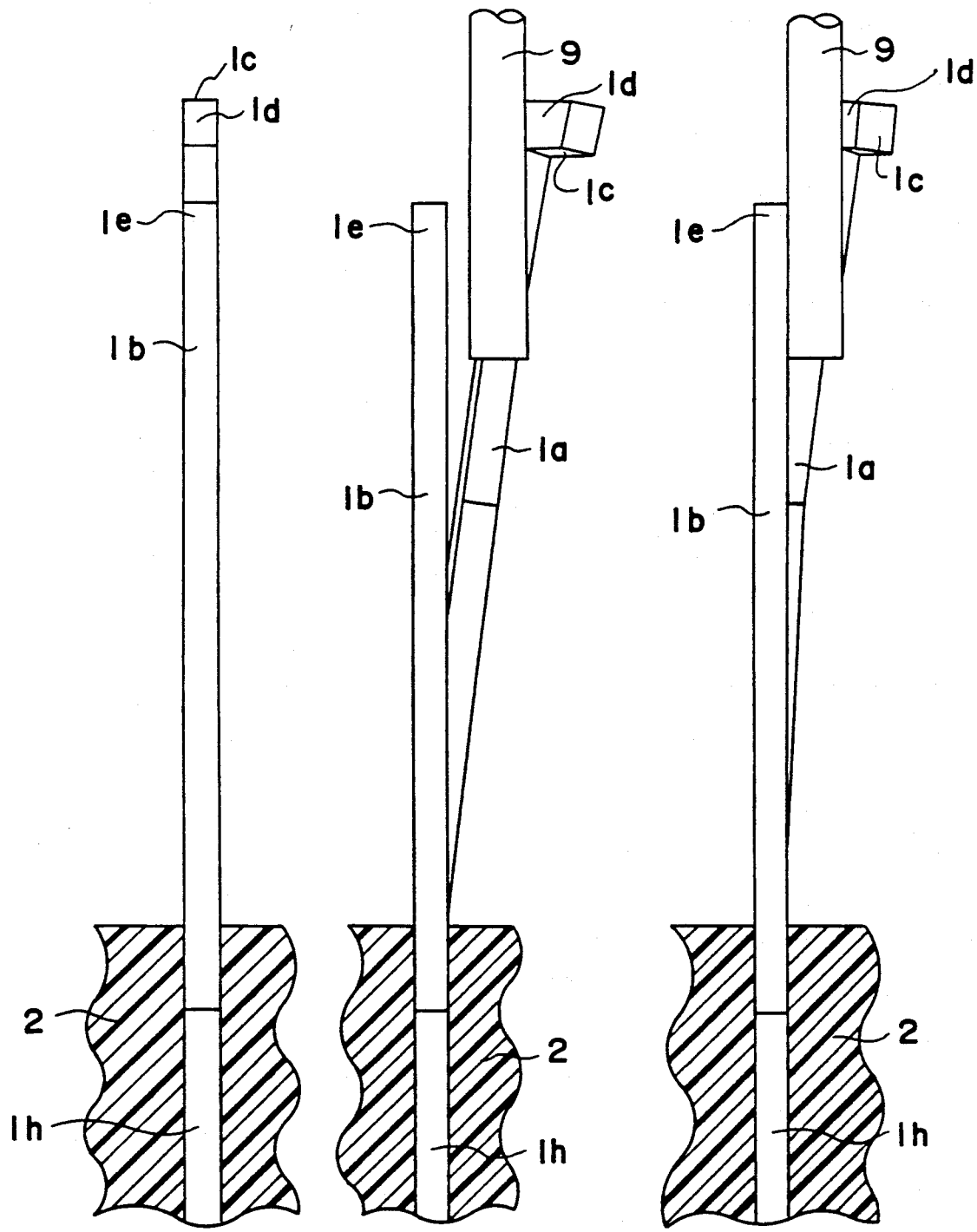

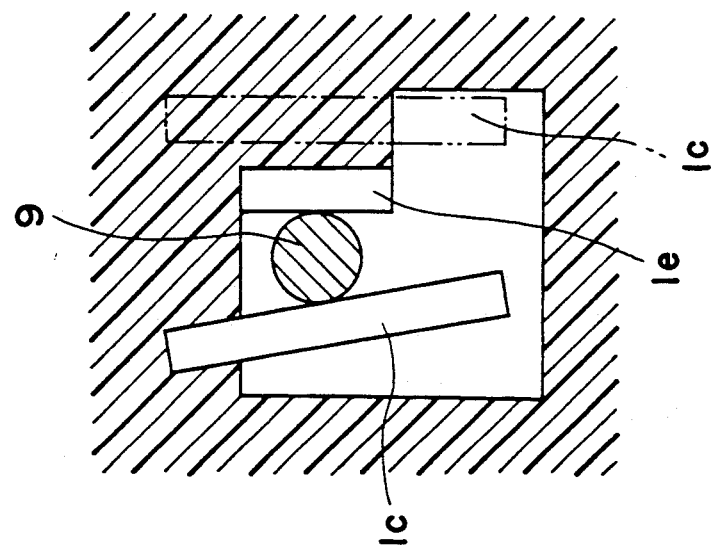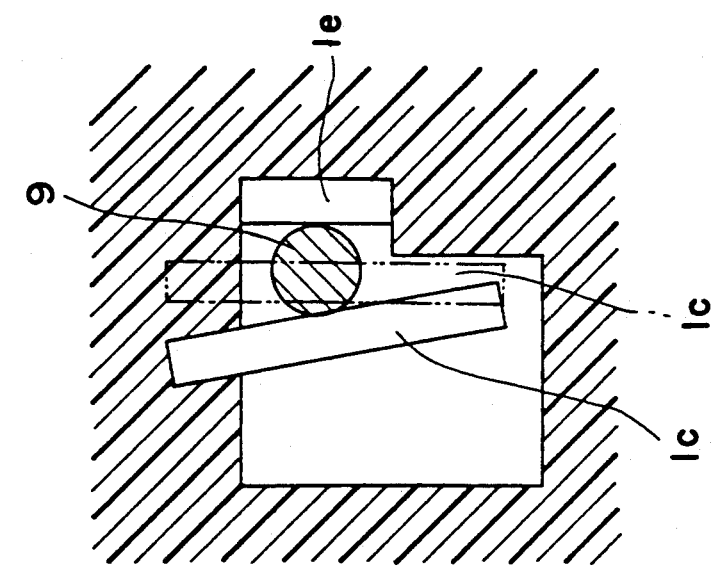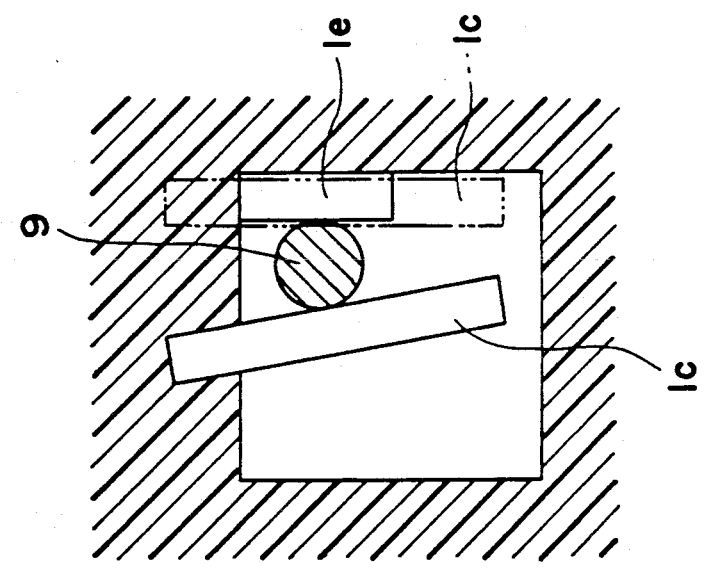

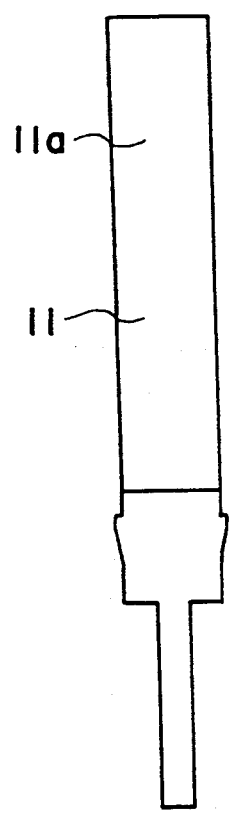
FIG.11 (A) PRIOR ART
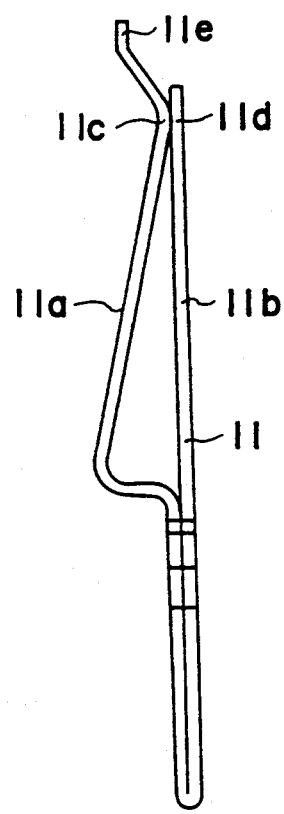
FIG.11 (B) PRIOR ART
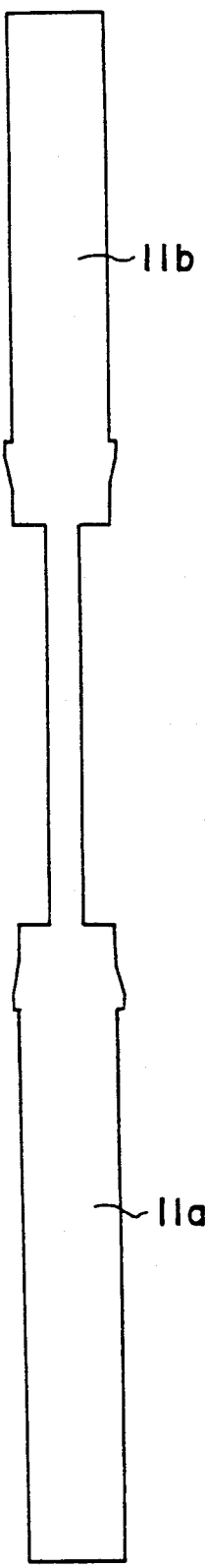
FIG.12 PRIOR ART

CONTACT IN A SOCKET FOR AN ELECTRIC PART

BACKGROUND OF THE INVENTION

1. Field of the Invention

This invention relates to a contact which is effectively used in a socket for an electric part such as an IC socket or the like, and more particularly to a contact in which contact elements of the contact are forcedly separated by a lateral movement in one direction of a moving plate provided on a socket body so that terminals of the electric part can be inserted and removed under no load, and the separating force is canceled by a lateral movement in the other direction of the moving plate so that the terminals of the electric part can be brought into contact with contact elements of the contact.

2. Prior Art

A conventional contact of this type, as shown by representative example in FIGS. 11a, 11b and 12, has a pair of elongated contact elements 11a and 11b disposed in such a manner that plate surfaces (outer surfaces of the contact material) face each other, contacting portions 11c and 11d being formed in the vicinity of the free ends of the contacting elements 11a and 11b so that a terminal of an electric part can be pinched between the plate surfaces of the contacting portions 11c and 11d, the leading end of the contact element 11a extending upward beyond the leading end of the other contact element 11b to form a pressure receiving portion 11e.

This conventional contact 11 is formed in such a manner that the contact elements 11a and 11b, as shown in FIG. 12, are cut out of a sheet of contact material in a developed shape, and then folded along a connecting portion to the afore-described facing state.

When in operation, the contact 11 is held by a socket body and the pressure receiving portion 11e is engaged with a lower surface of a moving plate which horizontally moves along the upper surface of the socket body, so that a pushing force is applied to the pressure receiving portion 11e of the contact 11 by a lateral movement of the moving plate in one direction to separate the contacting portions 11e and 11d and an electric part is inserted therebetween and removed therefrom under no load, and the separating force is removed by a lateral movement of the moving plate in the other direction, thereby to achieve the above-described pinching contact.

However, this conventional contact requires a comparatively complicated bending treatment, and a large amount of a metallic material is consumed for a single contact. In addition, the productivity of the contact is inferior, dimensional accuracy thereof is difficult to obtain, and the contact becomes expensive.

The present invention has been made in view of the above problems.

SUMMARY OF THE INVENTION

It is therefore an object of the present invention to provide a contact in a socket for an electric part which can overcome the above-described problems.

In order to achieve this object, a contact in a socket for an electric part according to the present invention comprises a first elongated contact element and a second elongated contact element formed by punching out of a sheet and having sheared surfaces disposed opposite each other. The first and second contact elements are interconnected at root portions thereof and provided at leading ends thereof with a contacting portion, respectively. The first and second elongated contact elements have respective first and second contact portions which are elongated transversely of the elongated contact elements and each extending toward the other elongated contact element. However, the first and second contact portions may be constructed such that while the second contact portion is elongated in the direction of elongation of the elongated contact elements, the first contact portion is elongated transversely of the elongated contact elements and extends toward the second elongated contact element. The inverted generally L-shaped contact element is formed into the inverted generally L-shaped bent form (angle) by the punching operation. The contacting portion of the first elongated contact element formed of the inverted generally L-shaped contact element is disposed in an upper position and the contacting portion of the second elongated contact element is disposed in a lower position opposed to contacting portion of the first contact element. The two contacting portions are disposed in such a manner as to be able to elastically separate in the direction laterally of their spacing without interfering with each other. The inverted generally L-shaped contact element forms a pressure receiving portion and a pushing force is applied to a side surface of the pressure receiving portion in order to generate the elastic displacement. The first elongated contact element and the second elongated contact element may be disposed opposite each other in the same plane, and the contacting portion of the first elongated contact element formed of the inverted generally L-shaped contact element and the contacting portion of the second elongated contact element may likewise be disposed in a vertically opposite relation in the same plane. A free end of the inverted generally L-shaped contact element may project backward beyond the contacting portion formed on the leading end of the second elongated contact element, and the pressure receiving portion may be the projecting portion.

The contact is mounted in a socket body, and an end portion of the inverted generally L-shaped contact element of the contact is engaged with a moving plate which is laterally movably disposed on an upper surface of the socket body. By a lateral movement of the moving plate, the reversed generally L-shaped contact is moved in the lateral direction against its elasticity and a terminal of an electric part is inserted under no load between the other contact element and the inverted generally L-shaped contact element. Upon removing the separating force, the inverted generally L-shaped contact piece is restored to its original position to engage the terminal in the lateral direction.

The above and other objects and features of the present invention will become more apparent to those skilled in the art upon reading the following detailed description of the preferred embodiment with reference to the accompanying drawings.

BRIEF DESCRIPTION OF THE DRAWINGS

FIG. 1A is a front view of a contact according to one embodiment of the present invention;

FIG. 1B is a side view thereof;

FIG. 1C is a top view thereof;

FIG. 2 is a perspective view thereof;

FIG. 3 is a perspective view of a socket for an electric part in which the contact of FIGS. 1A-1C is used;

FIGS. 8A-8C and 9A-9C are enlarged views showing the relation between the movement of the contact and the terminal of an electric part, and in which FIG. 8A is a plan view of the contact;

FIG. 8B is a plan view in which a lateral force is exerted on the contact to insert the terminal therein;

FIG. 8C is a plan view in which the lateral force exerted on the contact is removed to attain a contacted state;

FIG. 9A is a side view corresponding to FIG. 8A;

FIG. 9B is a side view corresponding to FIG. 8B;

FIG. 9C is a side view corresponding to FIG. 8C;

FIG. 10A is a plan view of the contact of FIG. 1, in which a state before the terminal is pinched and a state after the terminal is pinched are shown by way of engagement with a moving plate;

FIG. 10B is a plan view showing another example thereof;

FIG. 10C is a plan view showing still another example thereof;

FIG. 11A is a side view of a prior art contact;

FIG. 11B is a front view thereof; and

FIG. 12 is a developed plan view thereof.

DETAILED DESCRIPTION OF THE PREFERRED EMBODIMENT

Figure 4:
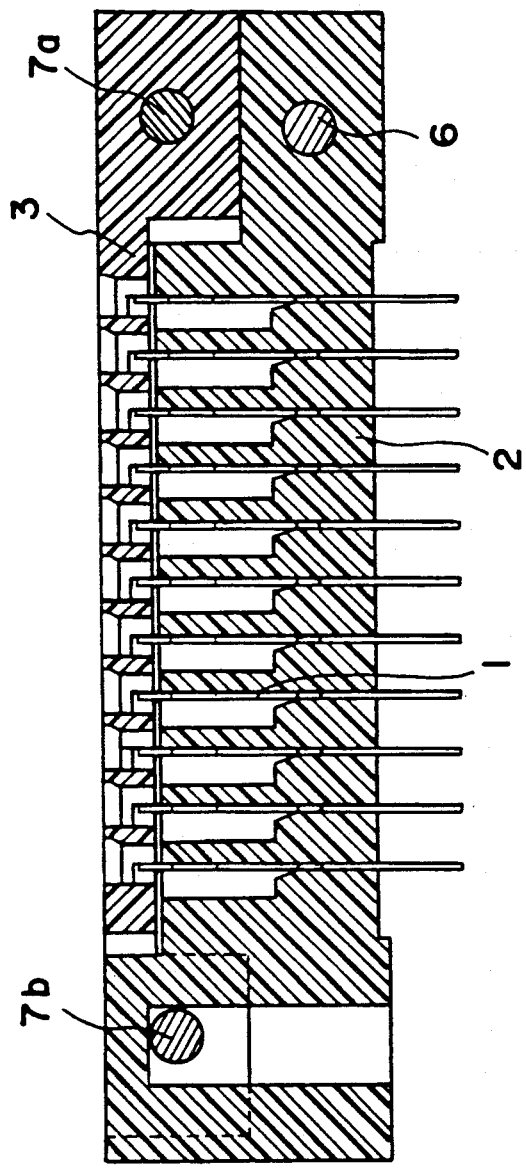
FIG. 4 is a sectional view of the socket.

One preferred embodiment of the present invention will be described with reference to FIGS. 1-10.

The numeral 1 designates a contact of the present invention. The contact 1 is formed by punching or die cutting the contact out of a felt-like flat sheet of metallic material. By the operation, a fork-like contact is formed having spaced side by side first and second elongated contact elements 1a and 1b which have the sheared edges facing each other are formed.

The first and second elongated contact elements 1a and 1b are connected to each other at root portions thereof and provided with a contacting portion, respectively, at leading ends thereof. The contacting portion of the first elongated contact element 1a is an inverted generally L-shaped contact portion 1c projecting toward the other contact element and is formed by the punching operation. The contact element 1b has contact portion 1c. The two contacting portions are arranged such that one contacting portion is located in an upper position and the other contacting portion is located in a lower position, and the two contacting portions can be displaced in the lateral direction, i.e. transverse to the direction in which they are spaced, without interfering with each other. The first and second elongated contact elements 1a and 1b are positioned to have the inverted generally L-shaped portion 1c and the contacting portion 1e on the contact element 1b arranged in upper and lower positions in the same plane. The lower surface of the first contact portion 1c and the upper surface of the second contact portion 1e normally face each other in an exactly registered relation as shown in FIG. 9(A). However, exact registration between the lower surface of the first contact portion 1c and the upper surface of the second contact portion 1e is not essential. Alternatively, the lower surface of the first contact portion 1c may be displaced relative to the upper surface of the second contact portion 1e in the rightward or leftward direction in FIG. 9(A) by an amount within the width of the upper surface of the second contact portion 1e, and vice versa. The first elongated contact element 1a is disposed in phase in the lateral direction by applying a pushing force on an outer surface in the lateral direction with respect to the inverted generally L-shaped contact portion 1c, and at the same time, the inverted generally L-shaped contact portion 1c is twist displaced in the lateral direction about the first elongated contact element 1a to form a terminal insertion gap 10 in the lateral direction between an outer surface of the second elongated contact piece 1b and the inverted generally L-shaped contact portion 1c.

In order to apply the pushing force to the inverted generally L-shaped contact portion 1c, a pressure receiving portion 1d is formed at a free end of the inverted generally L-shaped contact portion 1c. As one suitable example, the free end of the inverted generally L-shaped portion 1c projects beyond the contacting portion 1e at the leading end of the second elongated contact element 1b to form the pressure receiving portion 1d. The contact portion 1e projects in an inverted generally L-shape toward the first elongated contact element 1a.

As described above, the contact portions 1c and 1e are disposed in such a manner as to be in upper and lower positions. The contact portion 1c is displaced in the lateral direction to form the no load insertion gap 10 extending in the lateral direction between the contact portions 1e and 1c. After a terminal 9 of an electric part 8 is inserted into the gap 10, the contact portion 1c is released from the displacement force and tends to return to its original position. In this way, the terminal 9 is pinched in a position vertically displaced from the axis of the terminal 9.

Furthermore, the first and second elongated contact elements 1a and 1b are provided at a connected portion 1f with a press-fit portion 1g for engaging in a socket body. Beneath the press-fit portion 1g, an external terminal 1h is formed in such a manner as to extend through the socket body 2 and project downward below the socket body 2 in order to be connected with a printed circuit board, etc. The external terminal 1h extends in the same plane as the first and second elongated contact elements 1a and 1b.

A plurality of contacts 1 as thus constructed are each mounted in and fixed to the socket body 2 similar to one in which the conventional contact 11 is mounted by using the press-fit portion 1g. Also, a moving plate 3 for moving horizontally along the upper surface of the socket body 2 is provided. The terminals 9 of an electric part 8 placed on the upper surface of the moving plate 3 are inserted into terminal insertion holes 3a formed in the moving plate 3 in order to be contacted with the contacts 1. Furthermore, in each contact the pressure receiving portion 1d formed on the leading end of the inverted generally L-shaped contact element 1c of the first elongated contact element 1a is engaged by the lower surface of the moving plate 3 (see FIG. 4).

Figure 5:
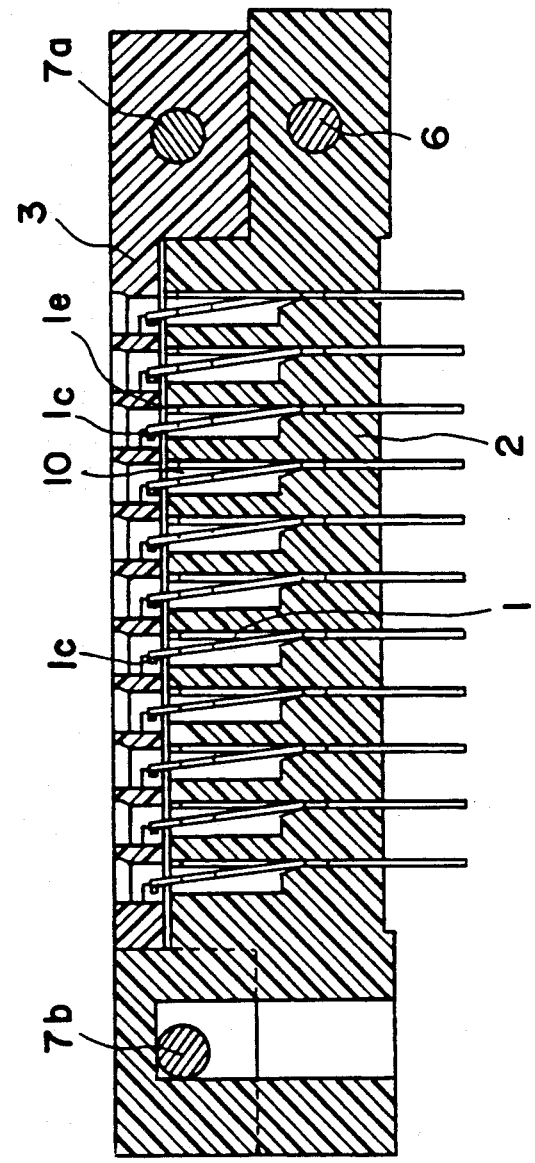
FIG. 5 is a sectional view of the socket, in which the contacts are separated by exerting a lateral force on the moving plate.
Figure 6:
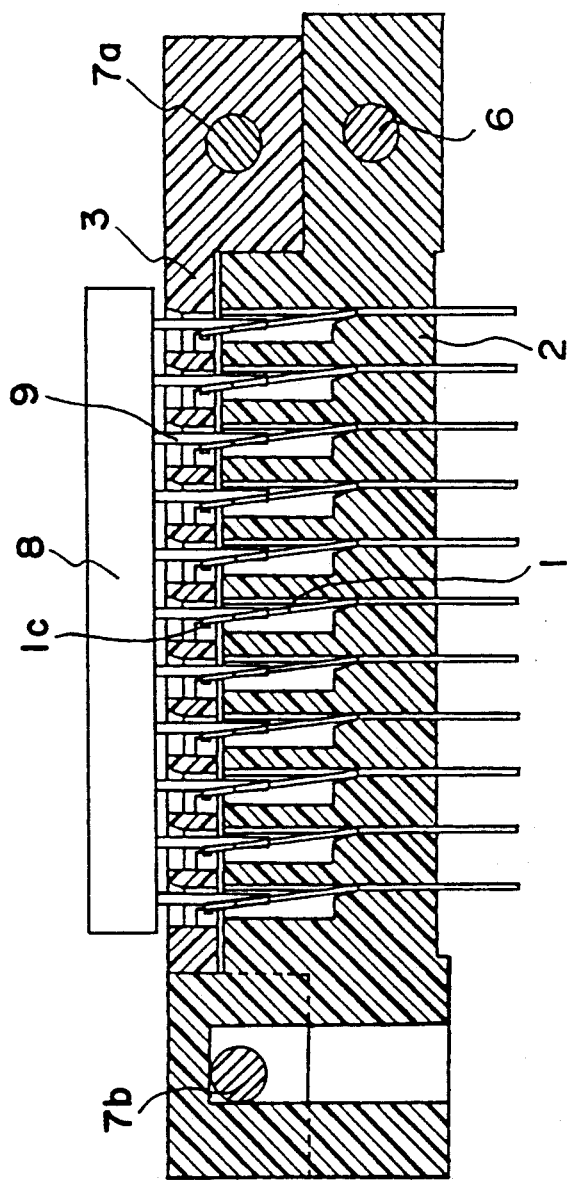
FIG. 6 is a sectional view of the socket in which an electric part is attached.
Figure 7:
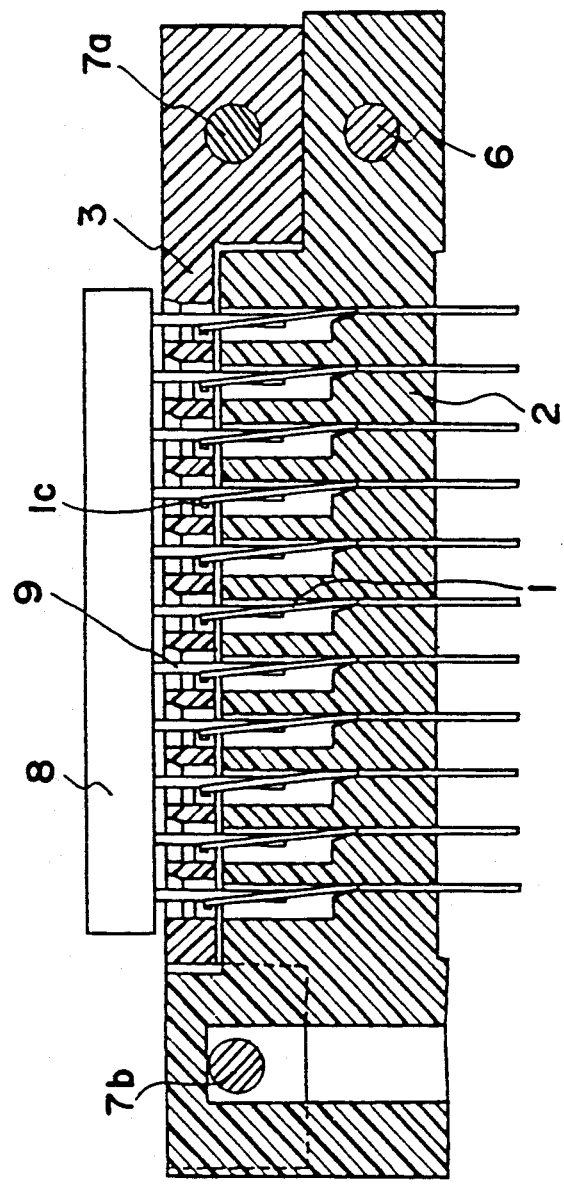
FIG. 7 is a sectional view of the socket in which the lateral force exerted on the moving plate is removed from the state shown in FIG. 6 to attain a contacted state.

As for a lateral movement means for the moving plate 3, as shown in FIG. 3 for example, a root end of an operating lever 4 is pivotally attached to one end of the moving plate 3 through a supporting shaft 6. The moving plate 3 also has a transmission lever 5 one end of which is pivotally attached to the other end of the moving plate 3. The other end of the transmission lever 5 and the root end of the operating lever 4 are pivotally attached to the moving plate 3 through a transmission shaft 7a. In this way, the lateral movement means for the moving plate 3 is formed. When the operating lever 4 is pivoted about the supporting shaft 6, moving plate 3 is laterally moved leftward in the drawings as shown in FIG. 5 by leftward movement of the transmission shafts 7a and 7b, and a pushing force directed in the left direction is exerted on the pressure receiving portion 1d which is engaged with the moving plate 3. As a result, in each contact the first elongated contact element 1a which is in a normally closed state is displaced in such a manner as to be forcedly separated in the lateral direction as shown in FIGS. 5, 8B and 9B to form the terminal insertion gap 10 between the contact portion 1e of the second elongated contact element 1b and the contact portion 1c on the first elongated contact element 1a. In this way, as is shown in FIGS. 6, 8B and 9B, a terminal 9 of the electric part 8 is inserted into a terminal insertion hole 3a formed in the moving plate 3 in order to be inserted into the terminal insertion gap 10 under no load. That is, the terminal 9 is inserted between the outer surface of the inverted generally L-shaped contact portion 1c and the contact portion 1e of the second elongated contact element 1b.

Thus, when the pivoting force exerted on the operating lever 4 is removed, the separating force exerted on the pressure receiving portion 1d is removed and the first elongated contact element 1a returns toward its normally closed state due to its elasticity while laterally moving the moving plate 3 in the opposite direction. As a result, in each contact the terminal 9 of the electric part 8 is pinched between the inverted generally L-shaped contact portion 1c on the first contact element 1a and the contact portion 1e of the second elongated contact element 1b to obtain an electric contact (see FIGS. 7, 8C and 9C).

Next, in order to remove the terminal 9 of the electric part 8 from the contact 1 under no load, the operating lever 4 is pivoted about the supporting shaft 6 again to exert a lateral moving force on the moving plate 3 through the transmission shafts 7a and 7b. As a result, a pushing force is exerted on the pressure receiving portion 1d of each contact 1 to forcedly move the first elongated contact element 1a against its elasticity and the pinching force exerted on the terminal 9 of the electric part 8 is removed to release it.

Furthermore, in order to adjust the force for pinching the terminal 9 of the electric part 8 between the first and second elongated contact elements 1a and 1b, as shown in FIG. 10A, both the first and second elongated contact elements 1a and 1b or the selected one of the first or second elongated contact elements 1a or 1b are subjected to a small amount of bending in the lateral direction, and when viewed from above, the inverted generally L-shaped contact portion 1c constituting the contacting portion of the first contact element 1a and the contact portion 1e of the second elongated contact element are in an initial position offset from each other by an amount no more than the thickness of said contact portion. In the illustrated case the contacting portion 1c is displaced slightly toward the location of the terminal. The terminal 9 is pinched when the contact portion 1c is displaced to the position shown by the solid line from the initial position shown by the phantom lines, and since the displacement is slightly less than if the contact portion 1c had been displaced starting from a position fully aligned with the contact portion 1e. Alternatively, inverted generally L-shaped contact portion 1c and the contact portion 1e are bent in such a manner that the contact portion 1c is offset to an initial position in the lateral direction a distance greater than the thickness of the material of the contact as shown by the phantom lines in FIGS. 10B and 10C. Then the first elongated contact portion 1a is displaced so as to displace contact portion 1c in a direction to the solid line positions in FIG. 10B or 10C. The displacement of the contact portion 1c in FIG. 10B is less than in FIG. 10A so that the pinching force on terminal 1, and the displacement in FIG. 10C will be more than in FIG. 10A. The pinching force of the contact portions 1c and 1e become strongest in the embodiment shown in FIG. 10C.

As described in the foregoing, according to the present invention, for example, the inverted generally L-shaped contact portion is moved against its elasticity in the lateral direction by a pushing force, etc. by the moving plate disposed on the socket body in such a manner as to be able to laterally move along the upper surface thereof, and a terminal of an electric part can be inserted under no load into a gap formed between the inverted generally L-shaped contact portion and the other contact portion, and upon removing the separating force, the inverted generally L-shaped portion moves back toward its original position to achieve a favorable pinching contact of the terminal in position displaced from the plane of the contact. This function can be effectively achieved by a contact shape which is produced by the above-described pinching or die cutting operation.

According to the above-described invention, there can be provided a contact which can have a zero insertion force for a terminal and which does not require such a complicated bending as a conventional contact, in which the amount of metallic material for manufacturing a single contact is reduced as much as possible to improve the yield of production, and which has excellent productivity, high dimensional accuracy and is inexpensive.

Although the present invention has been described with reference to a preferred embodiment, the invention is not limited to this embodiment. Many modifications and changes can of course be made within the spirit of the present invention.

What is claimed is:

1. A contact for insertion into a socket of an electric part and for receiving a terminal therein, comprising:
    a first elongated contact element and a second elongated contact element made of a resilient conductive material and disposed in spaced parallel relation in a flat plane, said first and second elongated contact elements being interconnected at respective one ends thereof to form a contact terminal for insertion into a socket, and having at the other ends thereof respective first and second contact portions which are elongated transversely of said elongated contact elements and each extending toward the other elongated contact element, said first contact portion on said first elongated contact element being further from said one ends in the direction of elongation of said elongated contact elements than said second contact portion of said second elongated contact element and being in spaced opposed relation thereto in said flat plane and extending past said second contact portion in the direction of elongation of said first contact portion, the part of said first contact portion extending past said second contact portion being a pressure receiving part, said contact portions being positioned for being elastically displacable in a direction laterally of both the direction of elongation of said elongated contact elements and said elongated contact portions and transversely to said flat plane without interfering with each other, whereby when a force is applied to said pressure receiving part in the lateral direction, said contact portions are separated in the lateral direction to form a terminal receiving opening therebetween into which a terminal can be inserted under no load, and upon release of the force, said contact portions move together to grip the terminal therebetween.

2. In combination, a socket body having at least one contact receiving recess therein, a contact for receiving a terminal and positioned in said recess, said contact having a first elongated contact element and a second elongated contact element made of a resilient conductive material and disposed in spaced parallel relation, said first and second elongated contact elements being interconnected at respective one ends thereof to form a contact terminal, said contact terminal being inserted into said socket, and said elongated contact elements having at the other ends thereof respective first and second contact portions which are elongated transversely of said elongated contact elements and each extending toward the other elongated contact element, said first contact portion on said first elongated contact element being further from said one ends in the direction of elongation of said elongated contact elements than said second contact portion of said second elongated contact element and being in spaced opposed relation thereto and extending past said second contact portion in the direction of elongation of said first contact portion, the part of said first contact portion extending past said second contact portion being a pressure receiving part, said contact portions being positioned for being elastically displacable in a direction laterally of both the direction of elongation of said elongated contact elements and said elongated contact portions without interfering with each other;

a movable block on said socket movable in said lateral direction and having a contact engaging portion thereon for engaging said pressure receiving part; and means for moving said movable block in said lateral direction for applying a force to said pressure receiving part for separating said first and second contact portions to permit receiving of a terminal therebetween, and for moving said movable block in a direction opposite said lateral direction for removing the force from said pressure receiving part to permit said contact portions to grip the terminal.

* * * * *